United States Patent
Ross et al.

(10) Patent No.: US 10,180,261 B1
(45) Date of Patent: Jan. 15, 2019

(54) MODEL BASED COOLING CONTROL SYSTEM

(71) Applicant: Amazon Technologies, Inc., Seattle, WA (US)

(72) Inventors: Peter George Ross, Olympia, WA (US); Adolfo Bravo Ferreira, Seattle, WA (US); Osvaldo P. Morales, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 254 days.

(21) Appl. No.: 14/981,685

(22) Filed: Dec. 28, 2015

(51) Int. Cl.
*F24F 11/00* (2018.01)
*F24F 11/30* (2018.01)
*G05B 13/04* (2006.01)
*F24F 11/62* (2018.01)

(52) U.S. Cl.
CPC ............. *F24F 11/30* (2018.01); *F24F 11/62* (2018.01); *G05B 13/048* (2013.01)

(58) Field of Classification Search
CPC ....... F24F 11/006; G05B 13/048; G05B 13/00
See application file for complete search history.

(56) References Cited

U.S. PATENT DOCUMENTS

| | | | | |
|---|---|---|---|---|
| 3,945,432 A | * | 3/1976 | Tamblyn | F24F 3/00 165/210 |
| 4,926,649 A | * | 5/1990 | Martinez, Jr. | F24F 3/06 236/91 F |
| 6,823,675 B2 | | 11/2004 | Brunell et al. | |
| 7,158,863 B1 | * | 1/2007 | Johnson | A47F 3/0447 62/256 |
| 8,504,175 B2 | | 8/2013 | Pekar et al. | |
| 9,313,929 B1 | * | 4/2016 | Malone | H05K 7/20745 |
| 2005/0072174 A1 | * | 4/2005 | Beers | B63J 2/04 62/228.1 |
| 2007/0180848 A1 | * | 8/2007 | Lazzarato | F24F 1/027 62/408 |

(Continued)

OTHER PUBLICATIONS

Hiroyoshi Kodama, et al., "Power-Aware Cooling Control Architecture for Container Data Center", Energy 2015: The Firth International Conference on Smart Grid, Green Communications and IT Energy-aware Technologies, IARIA, 2015, pp. 37-45.

(Continued)

*Primary Examiner* — Kenneth M Lo
*Assistant Examiner* — Chad G Erdman
(74) *Attorney, Agent, or Firm* — Robert C. Kowert; Meyertons, Hood, Kivlin, Kowert & Goetzel, P.C.

(57) ABSTRACT

A computer room includes rack mounted computing devices and multiple air handling systems for cooling the computer room. A model based cooling control system is implemented on resources of a provider network that includes the rack mounted computing devices. The model based cooling control system uses a model of the computer room to iteratively perform calculations to determine a set of control parameters for cooling the computer room. The set of control parameters are selected to reduce or optimize an amount of energy and/or water used to cool the computer room while satisfying one or more conditions for cooling the computer room such as a maximum allowable temperature of the room and/or a maximum allowable temperature of the rack mounted computing devices in the computer room.

20 Claims, 11 Drawing Sheets

(56) References Cited

U.S. PATENT DOCUMENTS

| | | | | |
|---|---|---|---|---|
| 2009/0138313 | A1* | 5/2009 | Morgan | G06Q 10/06 705/7.23 |
| 2010/0154448 | A1* | 6/2010 | Hay | H05K 7/20745 62/175 |
| 2011/0014061 | A1* | 1/2011 | Hopkins | F04D 25/166 417/3 |
| 2014/0278333 | A1* | 9/2014 | Gupta | H04L 41/145 703/18 |
| 2015/0052919 | A1* | 2/2015 | McGowan | F25B 25/005 62/118 |
| 2015/0060038 | A1* | 3/2015 | Lau | H02P 7/295 165/244 |
| 2015/0134123 | A1* | 5/2015 | Obinelo | F24F 11/006 700/277 |
| 2016/0381826 | A1* | 12/2016 | Barbato | F24F 5/001 62/91 |

OTHER PUBLICATIONS

D. Gratton, et al., "Reduced-order trajectory piecewise-linear models for nonlinear computational fluid dynamics", 34th AIAA Fluid Dynamics Conference and Exhibit, Jun. 26-Jul. 1, 2004, AIAA 2004-2329, pp. 1-10.

S. Hovland, et al., "MPC for Large-Scale Systems via Model Reduction and Multiparametric Quadratic Programming", Decision and Control, 45th IEEE Conference, Dec. 13-15, 2006, pp. 3418-3423.

"Model predictive control" Wikipedia, the free encyclopedia, Retrieved from URL: https://en.wikipedia.org/wiki/Model_predictive_control, Downloaded on Nov. 10, 2015, pp. 1-6.

Honeywell, "Honeywell and DLB Work Together to Reduce Energy Costs and Improve Reliability at Data Center", Feb. 2012, pp. 1-4.

S. Joe Qin, et al. "A survey of industrial model predictive control technology", Department of Chemical Engineering, Control Engineering Practice II, 2003, pp. 733-764.

Yodong MA, et al., "Predictive Control for Energy Efficient Buildings with Thermal Storage", IEEE Control Systems Magazine, Feb. 2012, pp. 44-64.

M. Ogawa, et al., "Cooling control based on model predictive control using temperature information of IT equipment for modular data center utilizing fresh-air", Retrieved from URL: http://ieeaxplore.ieee.org/xpl/login.jsp?tp=&arrunber=6704235&url=http%3A%2F%2Fieeexplcre.ieee.org%2Fxpls%2Fabs_all.jsp%3Farnumber%3D6704235 on Nov. 10, 2015, pp. 1-2.

* cited by examiner

MODEL BASED COOLING CONTROL SYSTEM

BACKGROUND

Electronic components generate waste heat when in use. This heat energy must be removed to prevent overheating and subsequent malfunction. Computer systems typically include a number of such components, or waste heat sources, that include, but are not limited to, printed circuit boards, mass storage devices, power supplies, and processors. For example, one personal computer system may generate 100 watts to 150 watts of waste heat and some larger computers with multiple processors may generate 250 watts of waste heat. Some computer systems include a plurality of such larger, multiple-processor computers that are configured into rack-mounted components, and then are subsequently positioned within a rack system. Some rack systems include 40 such rack-mounted components and such rack systems will therefore generate as much as 10 kilowatts of waste heat. Moreover, some data centers include a plurality of such rack systems.

In some datacenters multiple air handlers and/or coolers of different types are used to supply cool air to rack systems in a room of a data center to remove waste heat from the rack systems. In some such data centers, the air handling devices and/or coolers are commonly controlled such that the room is treated as a homogenous unit. The air handlers and/or coolers respond in unison to thermal changes in the room. Such an arrangement may lead to inefficiencies such as providing excess cooling to portions of a data center room that require less cooling than other portions of the data center room. Also, such configurations may lead to inefficiencies due to a lack of coordination between the air handlers, coolers, and other auxiliary systems that support the air handers and coolers. In another example, in the case of a failure of one of the air handlers or coolers in such systems, the systems may not be able to properly adapt to the failed air hander or cooler. This may result in providing insufficient cooling to rack systems in the room of the data center.

In some data centers, computational capacity available for use by a cooling system controller may be limited. For example, in some data centers a cooling system controller may be implemented on a simple process logic controller with minimal computational capacity.

Figure 1A:
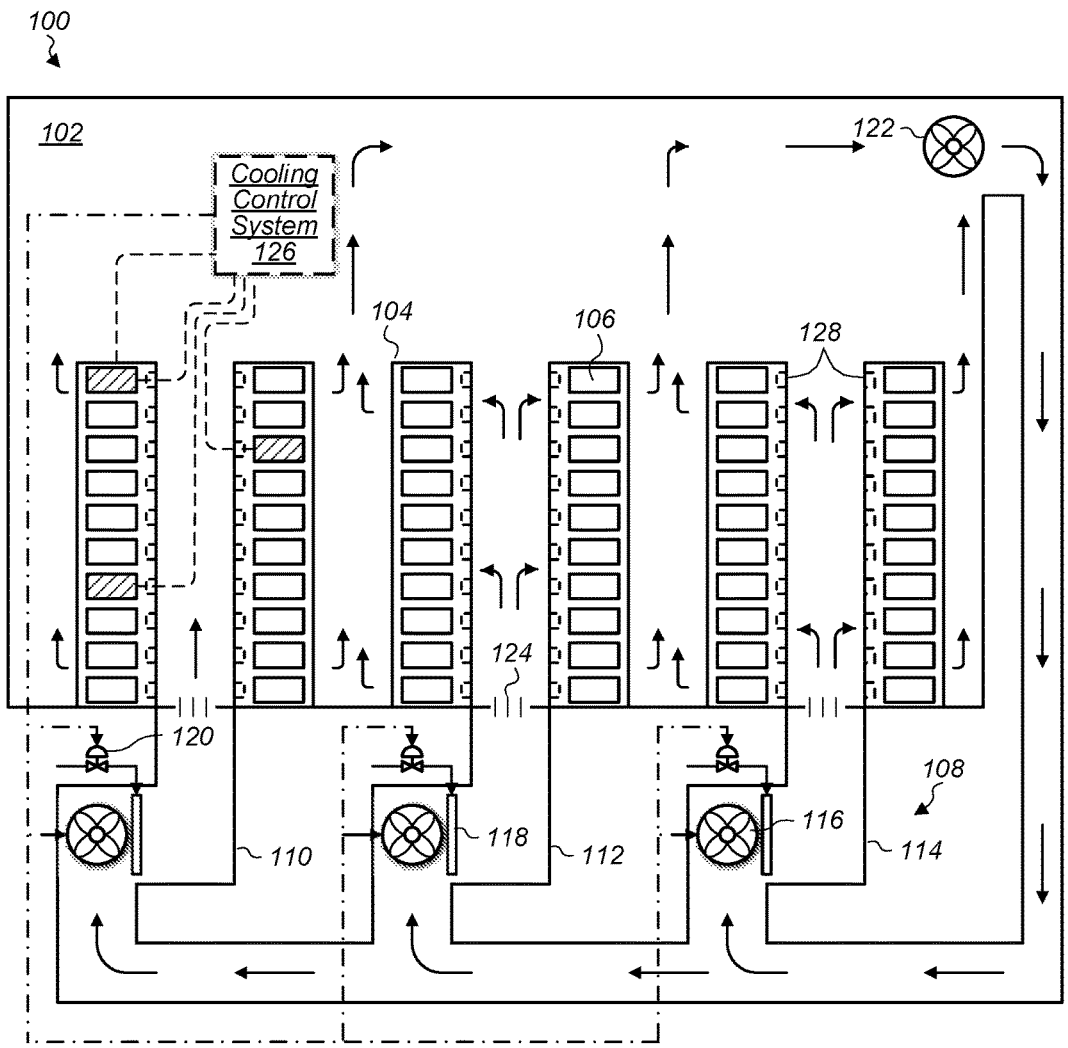
FIG. 1A is a schematic diagram illustrating a data center room with a model based cooling control system, according to some embodiments.

The various embodiments described herein are susceptible to various modifications and alternative forms. Specific embodiments are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of a system, method, and a storage medium storing program instructions for cooling electronic equipment in a data center are disclosed. According to one embodiment, a data center includes multiple rack mounted computing devices (also referred to herein as "computer systems") in a room of the data center. A plurality of sensors in the data center are configured to sense conditions related to the rack mounted computing devices. A cooling system of the data center includes multiple air handling devices and a cooling control system implemented at least in part on one or more of the rack mounted computer devices in the room of the data center. The cooling control system is configured to receive condition information from the sensors indicating conditions in the room. For example, the cooling control system may receive current temperature information related to the multiple rack mounted computing devices and information regarding current airflow through the rack mounted computing devices such as a measure of air recirculation through the rack mounted computing devices. The cooling control system is also configured to use a model to iterate through multiple sets of control parameters for controlling the air handling devices, determine predicted room conditions for the multiple sets of control parameters, and determine corresponding predicted energy usages associated with each of the multiple sets of control parameters. The cooling control system is configured to select a set of control parameters for controlling the plurality of air handling devices from the multiple sets of control parameters that were modeled. The cooling control system is configured to select a set of control parameters that results in less energy usage than other ones of the multiple sets of control parameters that were modeled, wherein the predicted room conditions that correspond with the selected set of control parameters do not exceed one or more constraints related to cooling the multiple rack mounted computing devices. For example, the cooling control system may select a set of control parameters that results in the least amount of energy consumption to cool the multiple rack mounted computing devices while not exceeding a constraint such as a maximum allowable temperature for the multiple rack mounted computing devices. The cooling control system is also configured to generate control outputs for controlling the air handling devices such that the air handling devices operate in accordance with the selected set of control parameters for a subsequent time interval.

According to one embodiment a method of cooling rack mounted computing devices in a room of a data center includes implementing a cooling control system at least in part on one or more of the rack mounted computing devices in the data center. The method also includes the cooling control system, implemented on the rack mounted computing devices, receiving condition information from sensors that monitor conditions in the rack mounted computing devices. The method includes the cooling control system iterating through multiple sets of control parameters for controlling air handling devices that provide cooling for the rack mounted computing devices, wherein for each iteration the method includes determining, based on a model of the room, predicted room conditions for a given set of control parameters and energy usage associated with the given set of control parameters. The method also includes the cooling control system selecting a set of control parameters from the modeled sets of control parameters, wherein the selected set of control parameters results in less energy usage than other ones of the sets of control parameters while not exceeding one or more constraints for cooling the room, such as not exceeding an upper temperature constraint. The method includes the cooling control system generating control outputs for controlling the air handling devices such that the air handling devices operate in accordance with the selected set of control parameters for a subsequent time interval.

According to one embodiment, a non-transitory computer readable storage medium stores program instructions for implementing a cooling controller, wherein the program instructions when executed are configured to implement the cooling controller on two or more rack mounted computer systems of multiple rack mounted computer systems in a data center. The cooling controller is configured to receive condition information from a plurality of sensors that monitor conditions in the plurality of rack mounted computing devices in the data center; iterate through multiple sets of control parameters for controlling multiple air handling devices that provide cooling for the computing devices, wherein for each iteration predicted room conditions for a given set of control parameters and predicted energy usage associated with the given set of control parameters are determined based on a model. The cooling controller is also configured to select a set of control parameters of the plurality of control parameters for controlling the plurality of air handling devices that results in less energy usage than other ones of the plurality of sets of control parameters, wherein the predicted room conditions for the selected set of control parameters do not exceed one or more constraints.

As used herein, "ambient" refers to a condition of outside air at the location of a system or data center. An ambient temperature may be taken, for example, at or near an intake hood of an air handling system.

As used herein, "computing" includes any operations that can be performed by a computer, such as computation, data storage, data retrieval, or communications.

As used herein, "computing device" includes any of various devices in which computing operations can be carried out, such as computer systems or components thereof. One example of a computing device is a rack-mounted server. As used herein, the term computing device is not limited to just those integrated circuits referred to in the art as a computer, but broadly refers to a processor, a server, a microcontroller, a microcomputer, an application specific integrated circuit, and other programmable circuits, and these terms are used interchangeably herein. Some examples of computing devices include e-commerce servers, network devices, and telecommunications equipment.

As used herein, "computer room" means a room of a building in which computer devices, such as rack-mounted servers, are operated.

As used herein, a "damper" includes any device or component that can be moved to control (e.g., increase or decrease) the flow of fluid through a duct or other passageway. Examples of dampers include plates, blades, panels, or discs, or any combination thereof. A damper may include multiple elements. For example, a damper may include a series of plates in parallel relation to one another that can be simultaneously rotated to close a duct. As used herein, to "position" a damper means to place or leave one or more elements of the damper to achieve desired flow characteristics through the damper, such as open, closed, or partially open.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, "evaporative cooling" means cooling of air by evaporation of liquid.

As used herein, "direct evaporative cooling" means cooling of air by evaporation of liquid directly into a stream of air to be cooled.

As used herein, a "free cooling mode" includes a mode of operation in which an air handling sub-system pulls air at least partially from an external source (such as air outside a facility) and forces the air to cool electronic equipment without active chilling in the air-handling sub-system (e.g., fluid flow through the chiller coils in the air handling sub-system is shut off by closing a flow control valve).

As used herein, "mechanical cooling" means cooling of air by a process that involves doing mechanical work on at least one fluid, such as occurs in vapor-compression refrigeration systems.

Some data centers include cooling control systems that use a controller such as a proportional, integral, and/or derivative controller (PID controller) to control multiple air handling devices that provide cooling for computing devices in a room of the data center. Such cooling control systems may treat a room of a data center as a homogenous unit, so that the PID controller generates a set of control outputs that cause the multiple air handling devices to respond in unison to temperature fluctuations, even if the temperature fluctuations are not uniform across the room. For example, a typical PID controller may cause multiple air handling devices to provide additional cooling to a room of a data center in response to computing devices in a particular rack in the room of the data center generating additional waste heat while computing devices in other racks in the room of the data center generate a constant amount of waste heat. This may result in all the racks in the computing room receiving additional cooling even though only one of the racks requires additional cooling to compensate for the additional amount of waste heat being generated. Such uniform responses lead to oversupplying cooling and therefore lead to inefficient uses of cooling resources.

Some data centers may include separate controllers for separate air handling systems, such as separate PID controllers for separate air handling systems. However, such systems may still lead to inefficiencies because the controllers of the separate air handling systems are not coordinated with each other. For example, in a data center room, changes in output of a particular air handling system may affect performance of other air handling systems also cooling computing devices in the same computing room. One such circumstance includes the effects of airflow from one air handling system affecting performance of adjacent air handling systems. For example an air handling system may provide cooling air to a particular row of rack computing devices and separate air handling systems may provide air to adjacent rows of rack computing devices in the same computer room. Some of the air supplied to the particular row of rack computing devices may pass into the adjacent rows of rack computing devices. Thus, when a flow of air is increased to the particular row it also may increases airflow in the adjacent rows. For example, as air flow to the particular row increases the air handling devices providing cooling to the adjacent rows may reduce their outputs to maintain a temperature in the adjacent rows. At the same time the air handling device providing cooling to the particular row may continue to increase its output of cooling air because a portion of the cooling air being supplied to the particular row is being lost to the adjacent rows. Eventually the air handling device providing cooling air to the particular row may reach a maximum output while the air handling devices providing cooling air to the adjacent rows are at relatively minimal outputs. Such an uneven application of cooling resources may be less efficient than a coordinated response where the air handling systems for the adjacent rows of rack mounted computing devices and the air handling system for the particular row of rack mounted computing devices work in coordination with each other to balance their outputs to optimally cool the particular row of rack mounted computing devices and the adjacent rows of rack mounted computing devices.

In contrast to the single PID controller or separate PID controllers discussed above, a model based cooling control system may receive condition information from sensors that sense conditions related to rack mounted computers in different portions of a room of a data center and determine an optimal or near optimal set of control parameters that allow different air handling devices to be operated in coordination with each other at different output levels based on different cooling needs in different portions of the room of the data center. As discussed in more detail below, a model based cooling control system may use a model to iteratively test different combinations of control parameters for controlling multiple air handling devices before implementing the different combinations of control parameters to determine a set of control parameters that meet one or more constraints for cooling computing devices in a room of a data center, such as a maximum allowable temperature, while minimizing or substantially reducing an amount of energy and/or water used to cool the rack mounted computing devices.

Using a model as part of a real time controller may require considerable computational resources. In a data center, a model based cooling control system may be implemented using computational resources available in the data center or by using computational resources of a provider network that includes the data center. Using computational resources of a data center or a provider network associated with the data center may permit the model based cooling control system to be implemented without considerably sacrificing model accuracy or controller speed. In some embodiments, unutilized compute resources in the data center are harnessed to implement the model based cooling control system. In addition, other techniques such as model simplification and reduced order modeling (ROM) may be used to improve the speed of calculation of a model based cooling control system while not significantly affecting model accuracy.

FIG. 1A is a schematic diagram illustrating a data center room with a model based cooling control system, according to some embodiments. Data center 100 includes computer room 102, racks 104, and rack mounted computing devices 106 mounted in racks 104 and organized in rows within computer room 102. Cooling system 108 includes air handling systems 110, 112, and 114. Air handling systems 110, 112, and 114 include air moving devices (e.g. fans) 116, evaporative cooling mediums 118, and water injection valves 120. Computer room 102 also includes return air fan 122. Return air fan 122 may be an independent air handling system or may be included as a subsystem in any one of air handling systems 110, 112, or 114. Air handling systems 110, 112, and 114 direct cooling air into cold aisles of computer room 102 via air ducts 124. FIG. 1A illustrates a data center with a subfloor air plenum, however in some embodiments air handling systems 110, 112, and 114 may distribute cooling air into computer room 102 via overhead plenums or other suitable air distribution channels. Sensors 128 sense conditions related to rack mounted computing devices 106. In some embodiments, sensors 128 may be physical sensors such as thermocouples, resistance temperature detectors, air pressure sensors, air flow sensors, etc. In some embodiments, sensors 128 may be virtual sensors configured to generate condition signals related to rack mounted computing devices 106 based on one or more relationships between the generated condition signals and one or more other measured values. For example a virtual sensor may determine a temperature related to a particular rack mounted computing device 106 based on a measured processor load of a processor of one of the rack mounted computing devices 106. In some embodiments a virtual sensor may indicate other room conditions in addition to temperature. For example, a virtual sensor may indicate an amount of recirculation of air flowing through rack mounted computing devices 106. A high amount of recirculation may indicate an air pressure imbalance in a room of a data center such as computer room 102.

In FIG. 1A, cooling control system 126 is implemented on three computing devices of computing devices 106 in separate ones of racks 104. In some embodiments, a model based cooling control system, such as cooling control system 126, may be implemented via virtual resources of a provider network, where the provider network includes physical computing resources, such as computing devices 106, that are located in several geographically remote data centers. In some embodiments, a model based cooling control system may be implemented via resources of a provider network, where the resources of the provider network that implement the cooling control system are located or partially located in the data center and/or computer room being cooled by the model based cooling control system or are located at a remote location. In some embodiments a model based cooling control system, such as cooling control system 126, may be implemented via more or less computing resources of a provider network than illustrated in FIG. 1A. Also, a quantity of computing resources used to implement a model based cooling control system, such as cooling control system 126, may vary based on varying compute demands needed to implement the model based cooling control system.

Figure 1B:
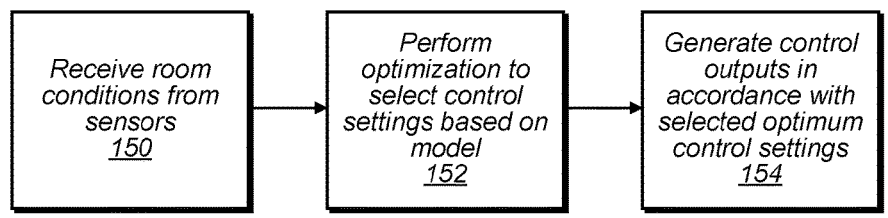
FIG. 1B is a flow chart illustrating operation of a model based cooling control system, according to some embodiments.

FIG. 1B is a flow chart illustrating operation of a model based cooling control system, according to some embodiments. At 150, a model based cooling control system, such as cooling control system 126, receives room conditions from sensors such as sensors 128. The room conditions are input into a model of the room being cooled by the model based cooling control system to update the model of the room being cooled by the model based cooling control system. For example, cooling control system 126 may input condition information from sensors 128 into a model of computer room 102 included in cooling control system 126 to update the model of computer room 102 included in cooling control system 126 to reflect a current state of computer room 102 and a current state of the rack mounted computing devices 106 included in computer room 102.

At 152, the model based cooling control system performs optimization calculations to select a set of control parameters for controlling air handling systems controlled by the model based cooling control system. For example, cooling control system 126 performs optimization calculations to determine control parameters for controlling air handling systems 110, 112, and 114. The control parameters may include fan speeds for fans in the air handling systems, such as fans 110, water injection rates (e.g. valve position) for injection valves, such as water injection valves 120, and fan speeds for return air fans, such as return air fan 122. The optimization calculations may include iterating through multiple sets of control parameters to determine corresponding predicted room conditions for multiple future time intervals for each set of control parameters and also determining corresponding predicted energy and water usages for the future time intervals for each set of control parameters. The optimization calculations may also include selecting a set of control parameters that meets one or more constraints for cooling rack mounted computer devices in a computer room, such as a maximum allowable temperature for the rack mounted computing devices. The optimization calculation may include selecting control parameters that result in consuming less energy and/or water than the other sets of control parameters.

At 154, after a set of control parameters have been selected for controlling air handling systems for a subsequent time interval, a model based cooling control system, such as cooling control system 126, may generate control outputs in accordance with the selected optimum or near optimum set of control parameters selected. The cooling control system may repeat receiving room conditions from sensors, updating a model of the room being controlled, performing an optimization to select control parameters based on the model, and generating control outputs in accordance with the selected optimum or near optimum set of control parameters each control cycle. A control cycle may be a frequency at which new control outputs are generated for controlling air handling devices that are controlled by a model based cooling control system. In some embodiments, a control cycle may be a minute or less, so that a model based cooling control system determines new control outputs such as fan speeds, water injection rates, etc. each minute or more quickly than each minute. In an intervening time between receiving new sets of control outputs, air handling systems, such as air handling systems 110, 112, and 114, may control according to a previous time interval's set of control outputs. For example, cooling control system 126 may instruct air handling system 110 to control at a fan speed of 80% and a water injection rate of 30%. Air handling system 110 may maintain fan 116 at 80% speed and water injection valve 120 at 30% until a subsequent set of control outputs is issued from cooling control system 126. In some embodiments, this may result in air handling system 110 maintaining the issued control outputs for approximately a minute until a new set of control outputs is generated by cooling control system 126. In some embodiments, a control cycle may be more or less frequent.

A model for use in a model based cooling control system may be based on a computational fluid dynamics (CFD) model of a data center room and a model that simulates control responses of air handling systems to control outputs. Several well-known CFD techniques that may be employed to generate a CFD model of a data center room. For example, CFD modelling techniques used to create a CFD model of a computer room for a model based cooling control system may include: a finite element method, a finite volume method, a finite difference method, a spectral element method, a boundary element method, and various other well-known CFD modelling techniques.

Figure 2:
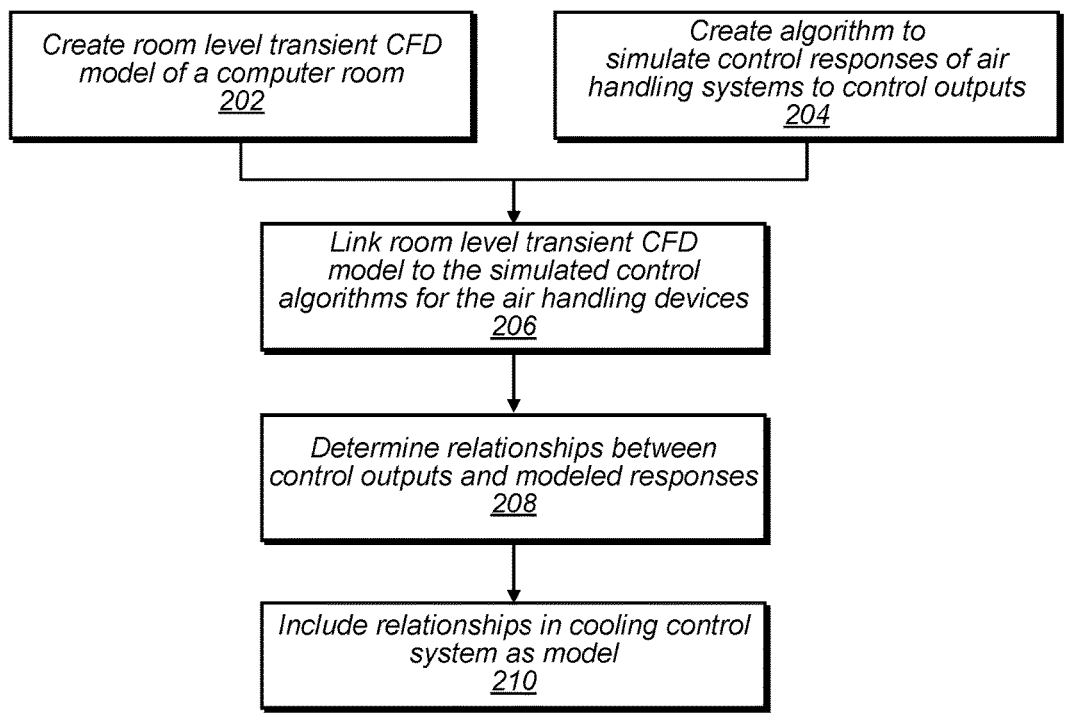
FIG. 2 is a flow chart for generating a model for use in a model based cooling control system, according to some embodiments.

FIG. 2 is a flow chart for generating a model for use in a model based cooling control system, according to some embodiments. At 202 a room level transient CFD model is created for a room of a data center. Concurrently or sequentially at 204, an algorithm to model control responses to control outputs for air handling systems is created. At 206 the room level transient CFD model is linked to the algorithm that models control responses to control outputs for the air handling systems. This allows a control output, such as a control output to a fan to operate the fan at a fan speed of 80% to be modeled in the CFD model by applying the volumetric flow of a fan operating at 80% to the CFD model.

In one example CFD modelling technique using finite volumes, a CFD model of a data center room divides the space in the data center room into several small geometric shapes with finite volumes. Heat producing components such as rack mounted computing devices are included in the model as heat sources on one or more boundaries of the data center room space. Also air handling systems are included in the model as cooling sources or air flow sources on one or more boundaries of the data center room space. The CFD model may model propagation of the application of cooling or air flow applied by air handling systems through the data center room space. The CFD model may also model propagation of waste heat from rack mounted computing devices as the waste heat propagates through the data center room space. The propagation may be modeled by applying the cooling, the air flow, or the generated heat to the boundaries of the model to determine an effect on finite volumes that border the parts of the data center room that have a boundary with the heat source or air handling system. The CFD model may then determine an effect that a change in the border finite volumes have on neighboring finite volumes. The CFD model may repeat this process until a steady state solution is reached or for a given amount of time of a time interval being modeled. The steady state solution may model the effects of an incremental change at one or more boundaries after the change has been propagated throughout the model so that the model is no longer changing, i.e. the model has reached a steady state.

In some embodiments, a transient CFD model may determine an effect of a change in a boundary condition over a time interval prior to the model of the data center room space reaching a steady state. For example, a time interval may be 10 seconds and the CFD model may determine the effects of an incremental change at a boundary after 10 seconds have elapsed (even though the incremental change continues to propagate through the data center space subsequent to the 10 second time interval). The non-steady state solution of a preceding time interval may be a starting condition for a subsequent time interval. For example, the effects of propagation of an incremental change at a boundary condition may be modeled for a first time interval (for example 10 seconds). At a subsequent time interval an additional change may be made, the additional change may be modeled to propagate through the data center room space in addition to the previous incremental change for the previous time interval. Thus, the effects of changes made in previous time intervals are included in modeling of subsequent time intervals. In some circumstances there may be a considerable lag time between when a change is made in an air handling system and when the change is detectable by sensors in the data center room. For example, an increase in water injection into an evaporative cooler may reduce the outlet temperature of the evaporative cooler by a certain amount. However, there may be a lag of up to several hours before this change is observed at sensors throughout the data center room space. Because a transient CFD model includes the effects of changes made in previous time intervals when modeling subsequent time intervals, a transient CFD model allows for dead bands or lag times to be incorporated into a model solution when evaluating different sets of control parameters.

At 208 relationships between modeled control outputs and modeled responses in a data center room space are determined. At 212 the relationships are included in the model based cooling control system. In some embodiments, the relationships between modeled control outputs and modeled response may be the linked transient CFD model and modeled control algorithms described at 206. In some embodiments, one or more techniques may be used to determine simplified relationships between the modeled control outputs and the modeled responses in the data center room space. Various model order reduction techniques may be employed to yield a reduced order CFD model or ROM CFD model. For example, in one such technique multiple modeled control outputs and modeled responses in the data center room space may be tested using a full transient CFD model. Results from these tests may be used to determine relationships such as a best fit curve between control outputs and modeled responses that may be included in a model based cooling control system. In other words, the full transient CFD model may be used to generate a simplified model that can model incremental changes in cooling or heat generation using less computational resources than the full transient CFD model. In some embodiments, other techniques may be used to simplify the model.

Figure 3:
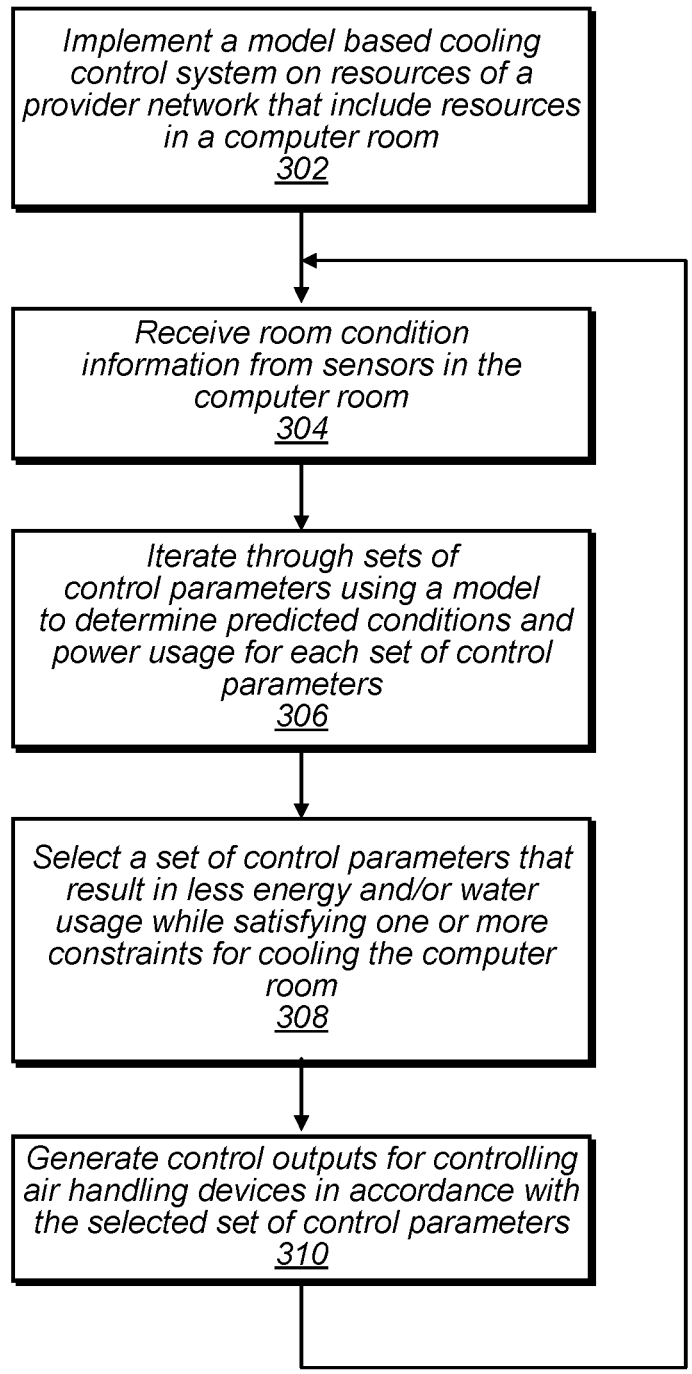
FIG. 3 is a flow chart for controlling conditions in a room of a data center using a model based cooling control system, according to some embodiments.

FIG. 3 is a flow chart for controlling conditions in a room of a data center using a model based cooling control system, according to some embodiments. A model based cooling control system, such as cooling control system 126, described in FIG. 1A may control conditions in a room of a data center as described in FIG. 3. Also, a model included in a model based cooling control system, such as cooling control system 126 may be a model such as the full CFD model or ROM CFD models described in FIG. 2.

At 302 a model based cooling control system is implemented on one or more compute resources of a provider network. The provider network may include computing resources of rack mounted computing devices that are cooled by a cooling system that includes the model based cooling control system. In some embodiments, the model based cooling control system may be configured to request additional compute resources be allocated for implementation of the model based cooling control system based on an amount of compute operations being performed by the model based cooling control system. For example, the model based cooling control system may execute a control cycle at regular time intervals, for example every minute. In order to ensure the model based cooling control system executes control cycles within a control cycle time window, for example a one minute time window, additional compute resources may be allocated for implementation of the model based cooling control system. In addition, the model based cooling control system may be configured to release compute resources allocated to implement the model based cooling control system when the compute resources are no longer needed to ensure the model based cooling control system executes control cycles within a control cycle time window. Thus a model based cooling control system implemented on compute resources of a provider network may expand and contract its compute capacity to ensure that the model based cooling control system executes control cycles within a given control cycle window.

At 304, the model based cooling control system receives room condition information from sensors, such as sensors 128 illustrated in FIG. 1A. A model based cooling control system may receive sensor information in a similar manner as described at 150 in FIG. 1B. At 306 and 308 an optimization is performed to select control parameters based on a model in a similar manner as described at 152 in FIG. 1B.

At 306 a model based cooling control system iterates through multiple sets of control parameters. For each set of control parameters the model included in the model based cooling control system is used to determine predicted room conditions and predicted energy consumption and/or water consumption that correspond with the set of control parameters over one or more future time intervals by applying the set of control parameters to the model to determine what the resulting conditions in the room and energy and/or water consumption that would result if those control parameters were selected.

At 308 a set of control parameters is selected from multiple sets of control parameters that were modeled using the model included in the model based cooling control system as described at 306. The selected set of control parameters may be selected based on determining that the selected set of control parameters will result in less energy and/or water consumption than other ones of the multiple sets of control parameters. One or more constraints may also be applied to select a set of control parameters. For example, a constraint may be that the predicted room conditions do not exceed a particular temperature, or a that none of the rack mounted computing devices are predicted to exceed a particular temperature. In some embodiments, other constraints may be used.

At 310, a set of control outputs are generated in accordance with the selected set of control parameters. The model based cooling control system then starts a new control cycle by receiving room conditions from sensors at 306 and the process repeats for each control cycle.

Figure 4:
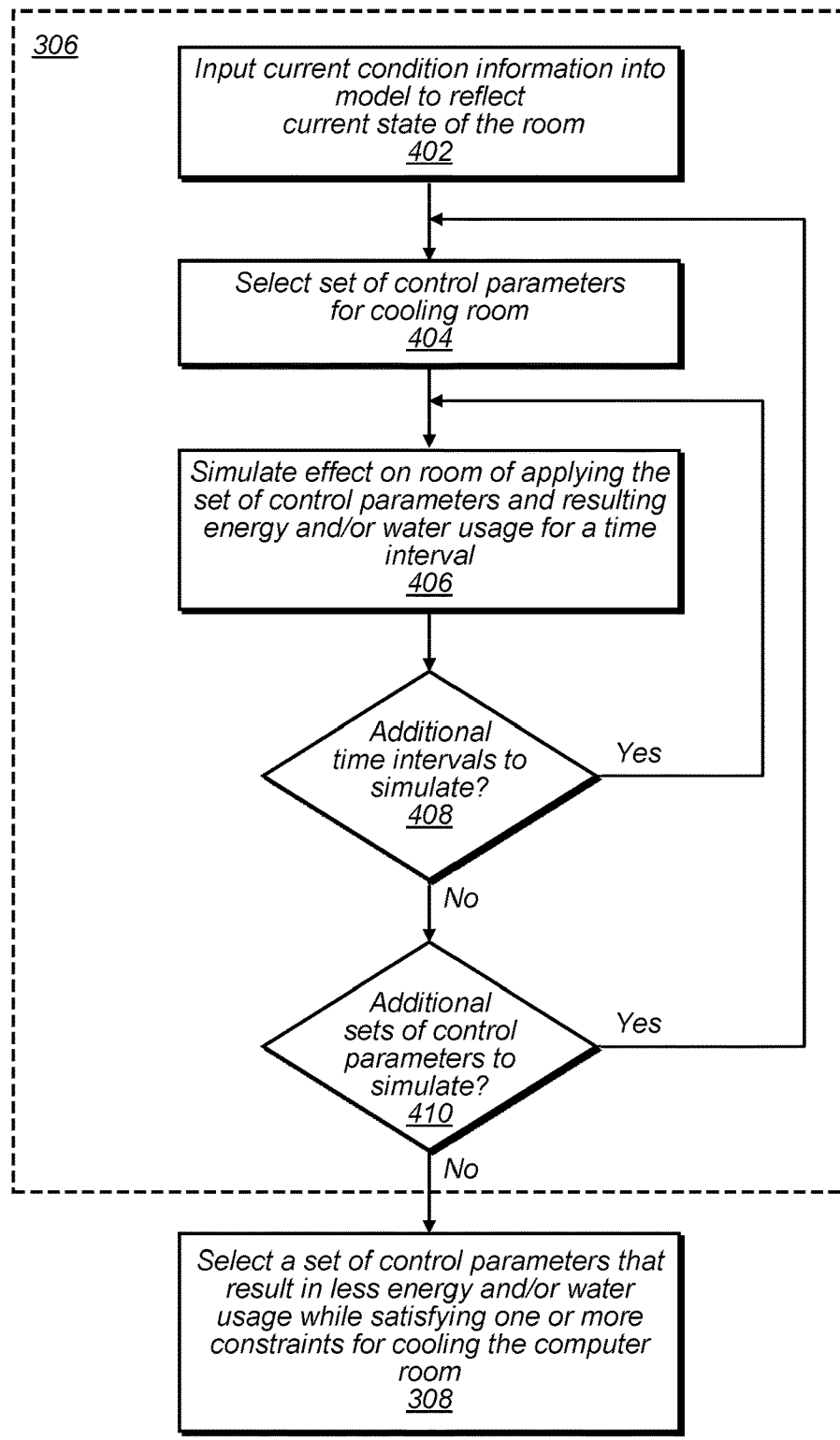
FIG. 4 is a flow chart for performing an optimization operation to select control parameters in a model based cooling control system, according to some embodiments.

FIG. 4 is a flow chart that illustrates an example of iterating through multiple sets of control parameters as described above in regard to 306 of FIG. 3.

At 402 current condition information received from sensors in a room of a data center is input into a model of a computer room included in a model based cooling control system. The model is updated to reflect a present state of the computer room being modeled. For example, temperature information, such as from sensors 128 in FIG. 1A, may be used to update a model in a model based cooling control system, such as cooling control system 126. The updated model may reflect current temperatures of rack mounted computing devices in a computer room being cooled by a model based cooing control system, such as rack mounted computing devices 106 in computer room 102 in FIG. 1A. An updated current model may also include current states of air handling systems that cool a computer room. For example, an updated model may include effects from flows of air and the temperatures of the flows of air from air handling systems 110, 112, and 114 based on current air handling control system control outputs. In some embodiments, an updated model may include outside ambient weather conditions and predicted weather conditions. For example, a model may be updated to utilize information regarding future weather conditions (e.g. weather forecasts) to determine predicted temperature and humidity conditions for outside air (air external to the data center) that may be used to cool the data center in a free cooling mode.

At 404 a set of control parameters for controlling air handling systems in a modeled simulation are selected. For example, a fan speed and a water injection rate may be selected for each of air handling systems 110, 112, and 114 as shown in FIG. 1A for use as control outputs for modelling to determine control outputs to be used in a subsequent time interval. Various optimization techniques may be used to select sets of control parameters to be simulated as part of an optimization. For example, a set of control parameters may be selected that are greater than or less than the current control parameters by a certain amount. In subsequent iterations, a set of control parameters may be selected based on whether or not a previous set of control parameters selected to be modeled yielded a more efficient modeled result. For example, for a particular air handling system, a first set of control parameters may include increasing a fan speed by a certain amount, for example 5%. If the increase in fan speed by 5% yields more efficient overall results, in a subsequent iteration, the fan speed may be increased by another certain amount. If the second increase in fan speed yields a less efficient overall result, a third iteration may select a fan speed that is between the first selected fan speed and the second selected fan speed. For simplicity this example describes changing a single fan speed between iterations. In some embodiments multiple variables such as fan speed, water injection rate, chilled water flow rate, chilled water temperature, and other air handling system control parameters may be changed individually or collectively from iteration to iteration.

At 406, the set of control parameters selected to be modeled are modeled in the updated model that reflects the current state of the computer room, i.e. the updated model determined at 402. The effects of controlling the air handling systems according to the set of control parameters selected to be modeled is determined for a time interval. For example, the selected set of control parameters to be modeled may include increasing a fan included in an air handling system by 10%. The effects of a corresponding increase in airflow from the air handling system that would result from increasing the fan speed by 10% is determined for a first (or subsequent) time interval. Also, a corresponding change in energy and/or water consumption is determined that would result from increasing the fan speed by 10%. These results, i.e. the resulting computer room conditions and resulting energy and water usage are stored for comparison to previous or subsequent iterations. For example, in a subsequent iteration, a set of control parameters selected to be modeled may include increasing the fan speed of the fan in the air handling system by 5% and increasing another fan in another air handling system by 3%. The modeled results of the second iteration may show that the predicted room conditions for the second set of control parameters selected to be modeled do not exceed one or more constraints such as a maximum allowable temperatures for rack mounted computing devices in the computer room, while consuming less energy than the first set of control parameters selected to be modeled.

At 408, it is determined whether there are more time intervals that need to be evaluated with the currently selected set of control parameters. For example, a currently selected set of control parameters may be modeled for time intervals such as 10 seconds, 1 minute, 10 minute, etc. For each set of control parameters selected to be modeled, multiple time intervals may be modeled. As an example, a time interval may be 10 seconds and a model based cooling control system may be configured to model predicted temperature conditions, energy consumption, and water usage for a time horizon of 2 hours. In such a configuration, predicted room conditions, energy usage, and water consumption may be modeled in sequential 10 second time intervals over a 2 hour time horizon to obtain a set of data points that correspond to predicted conditions at 10 second intervals for 2 hours into the future. Note that 10 second time intervals and a two hour time horizon are given as examples. In some embodiments, a model based cooling control system may use different time intervals and may model more or less time into the future. In some embodiments, time intervals used to model room conditions, energy consumption, and water usage for a given set of control parameters may not be of uniform increments over a time horizon or may not be of the same duration, but may instead vary in duration through a time horizon. For example, when modeling predicted room conditions, energy consumption and water usage, longer duration time intervals may be used for initial time intervals starting at the present time and going into future time intervals in a time horizon. As modeled room conditions, energy consumption, and water usage start to converge on a solution (i.e. the change in predicted room conditions, energy consumption, and water usages varies less with each subsequent time interval), the duration of the time intervals may be reduced. In some embodiments, a number of time intervals to be modeled may vary based on convergence of a solution as described above.

In some embodiments, multiple time intervals may be optimized at least partially at the same time in order to increase a control cycle frequency. For example, a first time interval may be optimized via a first set of one or more compute resources and prior to finishing the optimization an intermediate solution (for example a partially optimized set of control parameters) may be provided to a second set of one or more compute resources being used to optimize control parameters for a subsequent time interval. The second set of one or more compute resources may begin performing calculations to determine an optimized set of control parameters for the second time interval while the first set of one or more compute resources is finishing the optimization for control parameters for the first time interval.

At 410, it is determined whether additional sets of control parameters are to be simulated. In some embodiments, a set of number of sets of control parameters may be simulated while performing an optimization operation. In some embodiments, a threshold increase in efficiency may be used to determine how many sets of control parameters are to be simulated. For example, a threshold increase in efficiency may include a simulated set of control parameters increasing the efficiency of the air handling systems 20% over the previous control outputs currently controlling the air handling systems. In such systems, if a threshold efficiency reduction is achieved by a set of simulated control parameters, the system may be configured to select that set of control parameters to use as control outputs. In some embodiments, other methods may be used to determine a number of sets of control parameters to be simulated. If there are additional sets of control parameters to be simulated, the model based cooling control system returns to 404 and selects the next set of control parameters to be simulated. If there are not additional sets of control parameters that are to be simulated, at 308 the model based cooling control system selects a set of control parameters to use as control outputs that result in less energy and/or water consumption than other ones of the sets of control parameters that were simulated. The selected set of control parameters may also satisfy one or more constraints for cooling a computer room and rack mounted computing devices in the computer room, such as maximum allowable temperatures for different areas of the computer room and/or maximum allowable temperatures for the rack mounted computing devices in the computer room.

In some embodiments, machine learning techniques may be used to update a model used in a model based cooling control system. Also, in some embodiments, a machine learning technique may be used to learn relationships between control outputs, energy consumption, and water usage. These learned relationships may be used to select sets of control outputs that match the learned relationships based on room conditions that are similar to previously observed room conditions.

Figure 5:
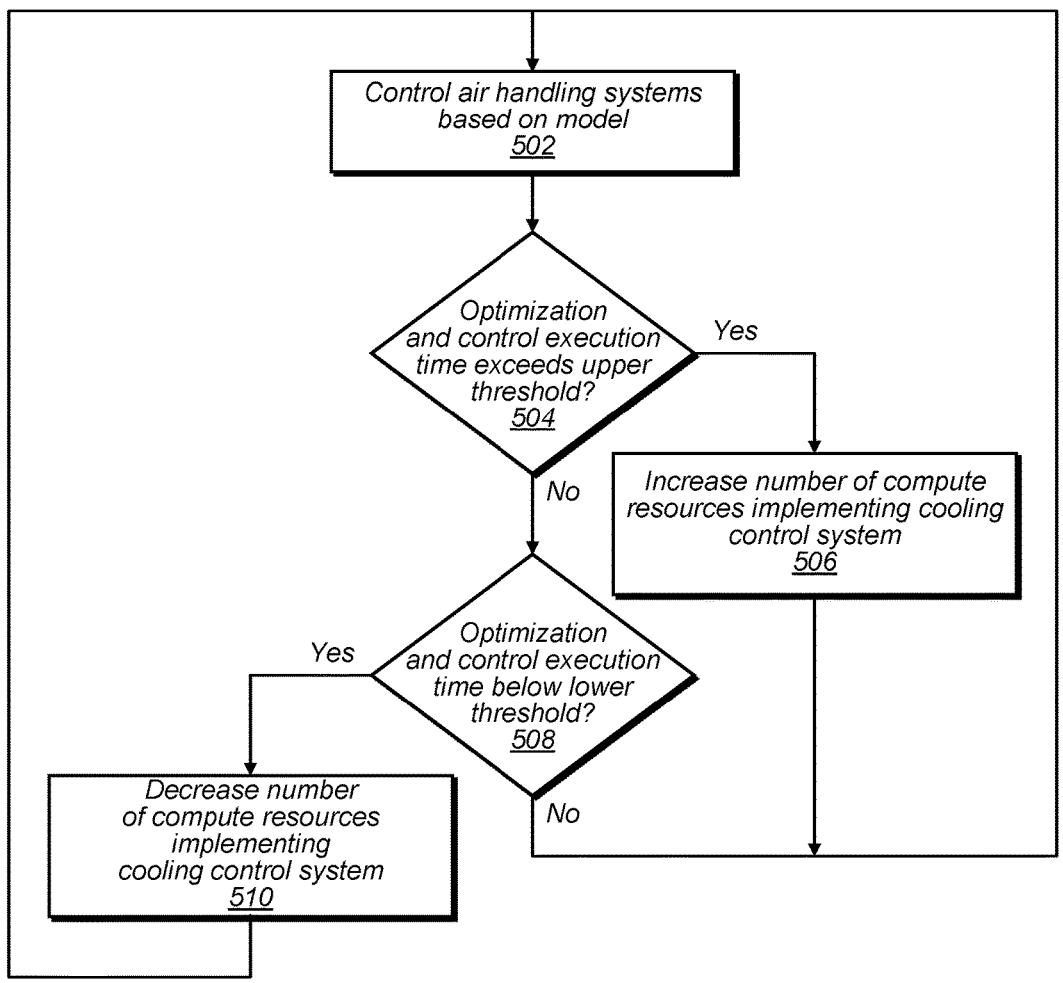
FIG. 5 is a flow chart for adjusting a quantity of compute resources used to implement a model based cooling control system, according to some embodiments.

FIG. 5 is a flow chart for adjusting a quantity of compute resources used to implement a model based cooling control system, according to some embodiments.

At 502, a model based cooling control system controls air handling systems based on a model included in the model based cooling control system.

At 504 it is determined whether execution of a control cycle (i.e. performing an optimization to select a set of control parameters and generating control outputs in accordance with the selected set of control parameters) exceeds an upper time threshold. For example, it is determined if a control cycle exceed a control window, such as a one minute control window. In some embodiments, control windows may be shorter or longer, for example, 1 second, 10 second, 30 second, etc. control windows.

At 506 in response to determining a current control cycle exceeds an upper limit threshold a number of compute resources used to implement the model based cooling control system is increased. Increasing the compute resources used to implement a model based cooling control system allows the model based cooling control system to execute control cycles more quickly and therefore reduce the amount of time necessary to perform a control cycle.

At 508 it is determined whether a control cycle (i.e. performing an optimization to select a set of control parameters and generating control outputs in accordance with the selected set of control parameters) is being performed in less time than a lower threshold limit (i.e. faster than a lower threshold limit). At 510, in response to determining a control cycled is being performed in less time than the lower threshold limit, a number of compute resources allocated to implement the model based cooling control system is reduced. Reducing the number of resources used to implement a model based cooling control system may free up resources of a provider network to be allocated for other uses.

Subsequent to 506 and 510 the model based cooling control system reverts to 502 and continues to monitor control cycle execution time to adjust a quantity of resources of a provider network that are being used to implement the model based cooling control system.

In some embodiments, a model based cooling control system may interact with a service of a provider network that automatically determines a quantity of compute resources needed to implement the model based cooling controller and automatically re-evaluates the number of compute resources needed to implement the model based cooling control system based on changing compute demand. In some embodiments, a model based cooling control system may utilize a machine learning service provided as a service of a provider network. For example, in some embodiments, a model based cooling control system may work in conjunction with a machine learning service to select sets of control parameters based on predicted room conditions, power consumption, and water usage as described in FIGS. 3 and 4.

In some embodiments, a model based cooling control system may have more than one operation mode. For example, a model based cooling control system may operate in a simple control mode when resources of a provider network that implement the model based cooling control system are constrained and may operate in one or more optimization modes, such as described above in regard to FIGS. 3 and 4. In some embodiments, a simple control mode may not include a model based optimization operation and may include feedback control such as proportional, integral and/or derivate control.

Figure 6:
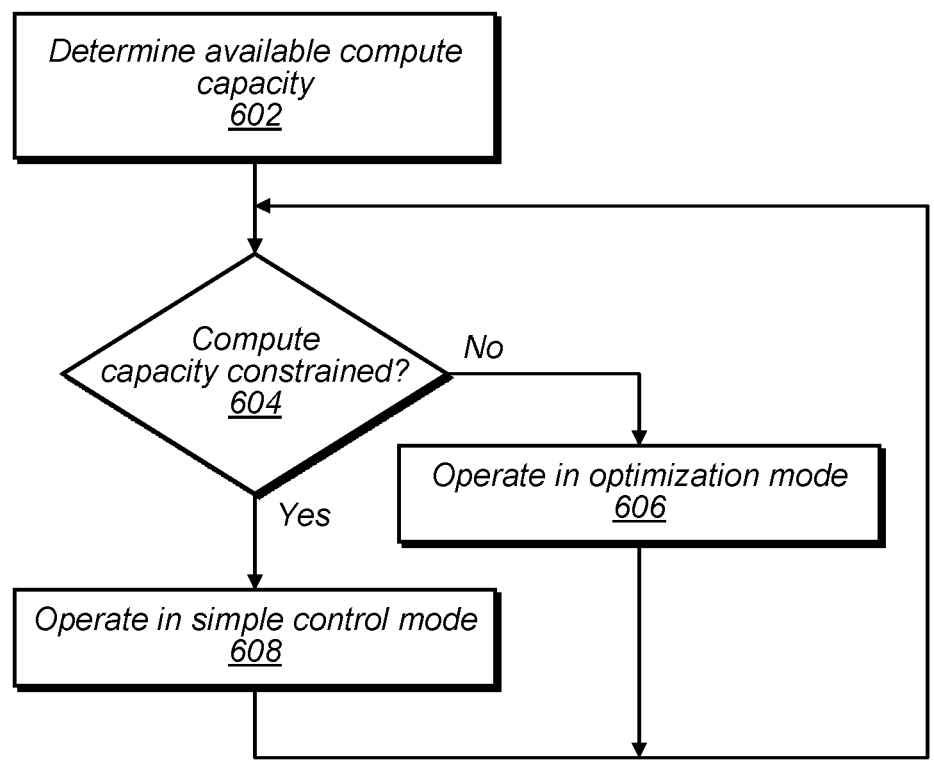
FIG. 6 is a flow chart for determining whether to operate a model based cooling control system in an optimization mode or in a simple control mode, according to some embodiments.

FIG. 6 is a flow chart for determining whether to operate a model based cooling control system in an optimization mode or in a simple control mode, according to some embodiments.

At 602 an available amount of compute capacity of a provider network available for use in implementing a model based cooling control system is determined.

At 604 it is determined whether or not the compute capacity of the provider network is constrained. For example the determined amount of compute capacity of the provider network available for use in implementing the model based cooling control system may be less than one or more thresholds. At 606 in response to determining the compute capacity of the provider network is not constrained, the model based cooling control system operates in an optimization mode and reverts back to 602 to continue to monitor the available amount of compute capacity of the provider network.

At 608, in response to determining the compute capacity of the provider network is constrained, the model based cooling control system operates in a simple control model and reverts back to 602 to continue to monitor the available amount of compute capacity of the provider network.

In some embodiments, a model based cooling control system may concurrently calculate control parameters using a simple control mode and calculate control parameters using an optimization mode. A model based cooling control system may provide a user interface configured to allow a user to compare control parameters calculated based on the simple control mode and the optimization control mode to a set of control outputs that are being used to control air handling devices. For example, a graphical representation may be provided via a user interface that depicts differences in control parameters in a simple control mode versus control parameters in an optimization mode. In some embodiments, additional graphical representations may be available via a user interface, such as predicted energy and/or water usage in a simple control mode and predicted energy and/or water usage in an optimization mode.

In some embodiments, a model based cooling control system may compare predicted energy and/or water usage in a simple control mode to predicted energy and/or water usage in an optimization mode. In response to a predicted energy and/or water usage in an optimization mode exceeding a predicted energy and/or water usage in a simple control mode for a threshold amount of time, a model based cooling control system may select to operate in the simple control mode for a period of time. For example, an instability in the optimization mode may cause the model based cooling control system when operating in the optimization mode to converge on a non-optimum set of control parameters. In this situation, the model based cooling control system may operate in a simple control mode. A model based cooling control system may monitor conditions in air handling systems controlled by the model based cooling control system to determine if the conditions that caused the instability have passed and may revert back to operating in the optimization mode. In some embodiments, a model based cooling control system may alert data center personnel of the instability and may revert to operating in the optimization mode after receiving an indication from data center personnel that the conditions causing the instability have been resolved.

In some embodiments, a model based cooling control system may monitor one or more thresholds for energy consumption or water usage. In response to determining that a current amount of energy being consumed or a current amount of water being used while operating in an optimization mode exceeds an energy consumption or water usage threshold, a model based cooling control system may operate in a simple control mode and alert data center personnel that the water and/or energy consumption threshold has been exceeded.

In some embodiments, air handling systems controlled by a model based cooling control system may include multiple cooling modes. For example, an air handling system may be configured to cool air in a free-cooling mode, an evaporative or direct evaporative cooling mode, a mechanical cooling mode, or any combination of these cooling modes.

Figure 7:
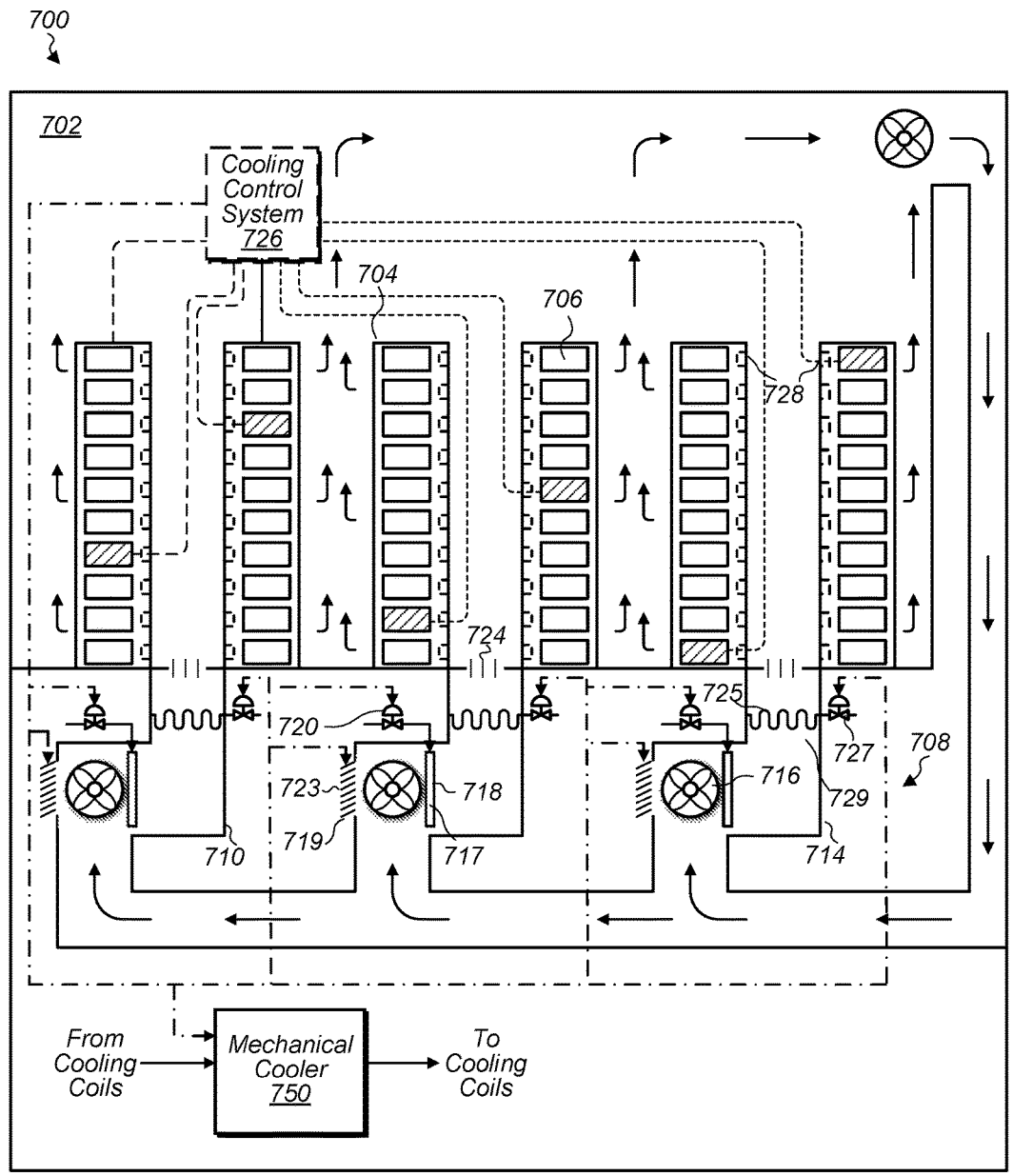
FIG. 7 is a schematic diagram illustrating a data center room with a model based cooling control system, according to some embodiments.

FIG. 7 is a schematic diagram illustrating a data center room with a model based cooling control system and air handling systems that are configured to operate in a free-cooling mode, a direct evaporative cooling mode, and a mechanical cooling mode, according to some embodiments.

Data center 700 includes computer room 702, racks 704, and rack mounted computing devices 706 mounted in racks 704 and organized in rows within computer room 702. Cooling system 708 includes air handling systems 710, 712, and 714. Air handling systems 710, 712, and 714 include air moving devices 716, evaporative cooling systems 717, free-cooling systems 719, and mechanical cooling systems 729. Evaporative cooling systems 717 includes evaporative cooling mediums 718, and water injection valves 720. Free-cooling systems 719 include fresh air dampers 723. Mechanical cooling systems 729 include cooling coils 725 and chilled water control vales 727. Mechanical cooling systems may receive chilled water from a mechanical cooler, such as mechanical cooler 750. In some embodiments, a mechanical cooler may provide chilled water or another cooling medium, such as a refrigerant, to a single mechanical cooling system or to multiple mechanical cooling systems. For example, in FIG. 7 mechanical cooler 750 supplies chilled water to each of the mechanical cooling systems 729 in air handling systems 710, 712, and 714. Air handling systems 710, 712, and 714 direct cooling air into cold aisles of computer room 702 via air ducts 724. FIG. 7 illustrates a data center with a subfloor air plenum, however, in some embodiments, air handling systems 710, 712, and 714 may distribute cooling air into computer room 702 via overhead plenums or other suitable air distribution channels. Sensors 728 sense conditions related to rack mounted computing devices 706.

When operating in a free-cooling mode, an air handling system, such as any of air handling systems 710, 712, or 714 may utilize ambient air to cool rack computing devices, such as rack computing devices 706 without using an evaporative cooling system and without using a mechanical cooling system. For example, when ambient conditions are suitable for free-cooling, one or more fresh air dampers 723 of air handling systems 710, 712, or 714 may be opened to allow ambient air external to data center 700 to be drawn into one or more of air handling systems 710, 712, or 714. At the same time one or more corresponding water injection valves 720 of evaporative cooling systems 717 may be closed and one or more corresponding chilled water control valves 727 of mechanical cooling systems 729 may be closed to stop flow of chilled water through mechanical cooling systems 729. In some embodiments, a mechanical cooler, such as mechanical cooler 750, may be turned off or put on standby while air handling systems, such as air handling systems 710, 712, and 714 are operating in a free-cooling mode.

When operating in a direct evaporative cooling mode, water may be injected into an air flow that is being used to cool components in a data center. In some embodiments, evaporative cooling may be used where a liquid is evaporated and a flow of fluid is cooled by passing through a heat exchanger that separates the evaporating liquid from the flow of fluid being cooled. FIG. 7 depicts air handling systems 710, 712, and 714 to be configured to operate in a direct evaporative cooling mode. For example, when operating in a direct evaporative cooling mode, water injection valves 720 may be used to control an amount of water injected into evaporative cooling mediums 718. Air directed from fans 716 passes through evaporative cooling mediums 718 and causes a liquid, such as water in evaporative cooling mediums 718 to evaporate. As the liquid evaporates it absorbs heat energy in the air flow and cools the air.

When operating in a mechanical cooling mode, chilled water or refrigerant may be circulated through coils in a path of air being directed from fans, such as fans 716, to cool the air as it passes by the coils. For example, air handling systems 710, 712, and 714 include cooling coils 725 in mechanical cooling systems 729. Chilled water control valves 727 may control a flow rate of chilled water or refrigerant flowing through cooling coils 725 to control a temperature of air being cooled by mechanical cooling systems 729.

In some embodiments, an air handling system may utilize multiple cooling modes at the same time. For example an air handling system may combine fresh air via a fresh air duct connected to a fresh air damper, such as fresh air dampers 723, with recycled air, to partially cool the mixed air via an evaporative cooling system, such as evaporative cooling system 717, and further cool the air via a mechanical cooling system, such as mechanical cooling system 729.

In some embodiments, a model based cooling control system, such as cooling control system 726 may optimize control parameters that include employing multiple modes of cooling. For example, a model based cooling control system, such as cooling control system 726, may optimize an amount of fresh air to utilize via fresh air dampers 723, an amount of water to be used in an evaporative cooler via adjusting water injection valves 720, and an amount of mechanical cooling to be applied via adjusting a chilled water flow rate via chilled water control valve 727 or a chilled water temperature via adjusting a chilled water set-point at mechanical cooler 750. As discussed above in regard to FIGS. 1-4 a model based cooling control system may iterate through various combinations of control parameters to determine a set of control parameters to be used to generate control outputs that optimize or nearly optimize energy consumption and/or water consumption while not exceeding one or more constraints on cooling a computer room and rack mounted computing devices in a computer room, such as a maximum allowable room temperature or a maximum allowable rack mounted computer temperature.

In some embodiments, sensors that sense conditions related to rack mounted computing devices may be virtual sensors. For example, sensors 128 in FIG. 1 and sensors 728 in FIG. 7 may be virtual sensors. A virtual sensor may be implemented in software and generate condition signals indicating conditions in rack mounted computing devices based, at least in part, on relationships between one or more other measurements and the generated condition signals. For example, a virtual temperature sensor may utilize a relationship between a processor workload, or an amount of power consumption and a temperature of a rack mounted computing device to generate a condition signal indicating temperature in the rack mounted computing device based on a processor workload measurement or based on a power consumption measurement.

Figure 8:
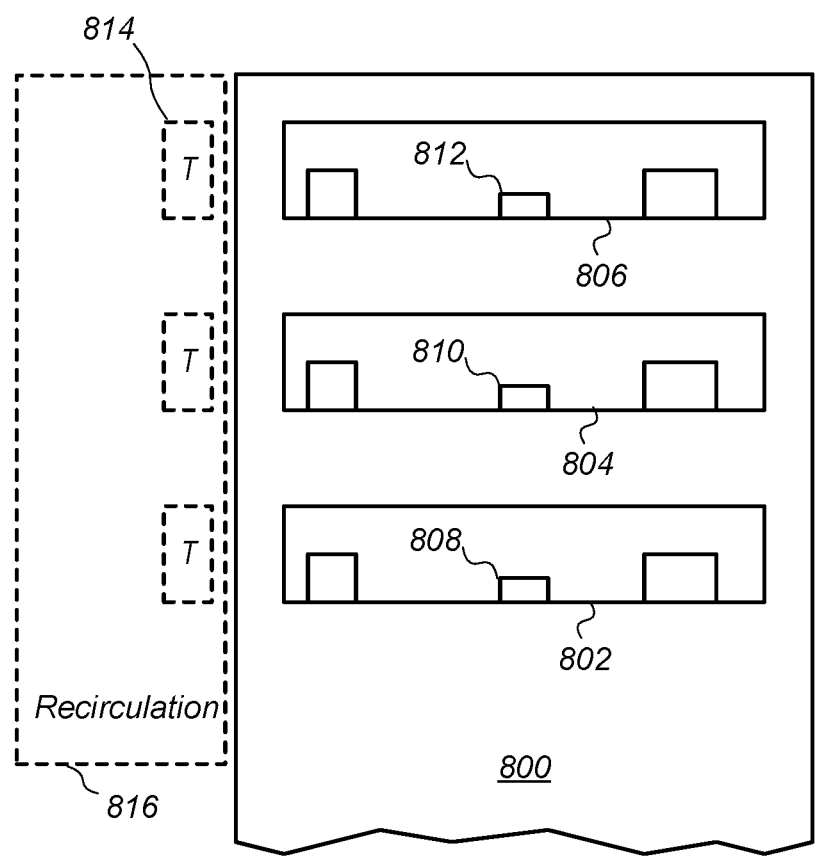
FIG. 8 illustrates computer systems mounted in a rack and virtual sensors that measure conditions related to the computer systems, according to some embodiments.

FIG. 8 illustrates computing devices mounted in a portion of a rack and virtual sensors that measure conditions related to the computing devices, according to some embodiments. Rack 800 includes rack mounted computing devices 802, 804, and 806. Rack computing devices include processors 808, 810, and 812. Also virtual temperature sensors 814 and virtual recirculation sensor 816 indicate conditions in rack mounted computing devices 802, 804, and 806. For example, virtual temperature sensors 814 determine an inlet temperature to rack computing devices 802, 804, and 806 based on a known relationship between workloads of processors 808, 810, and 812 and inlet air temperatures at inlets to rack mounted computing devices 802, 804, and 806. In some embodiments, other measured conditions within a rack mounted computing device, such as hard drive workload, power supply conditions, etc. may be used in a virtual sensor to determine an inlet temperature to a rack mounted computing device.

A virtual recirculation sensor may indicate an amount of air that is being recirculated through rack mounting computing devices. For example air exiting a rack mounted computing device that has picked up thermal energy when cooling heat producing components in a rack mounted computing device may be drawn back into an inlet of the same or a different rack mounted computing device as recirculated air. Often recirculation is caused by pressure imbalances between air inlets to rack mounted computing devices and air outlets from rack mounted computing devices. Also, openings between a cold aisle that supplies cooling air to rack mounted computing devices and a hot aisle that receives heated air from a rack mounted computing device may result in recirculation. A virtual recirculation sensor may compare variations in temperatures in rack computing devices, such as temperatures of virtual inlet temperature sensors to determine a measure of recirculation. In some embodiments, an amount of recirculation indicated by a virtual recirculation sensor may be based on a difference between the highest and lowest determined inlet temperatures for a given rack. In some embodiments, a model based cooling control system may be configured to select an optimum or near optimum set of control parameters while satisfying one or more conditions such as an acceptable amount of recirculation that may be tolerated. In order to reduce recirculation, a model based cooling control system may increase or decrease fan speeds of air handling devices controlled by the model based cooling control system. Changing fan speeds may alter air pressure conditions in a data center room such that an amount of recirculation in rack mounted computing devices in the computer room is reduced.

Figure 9A:
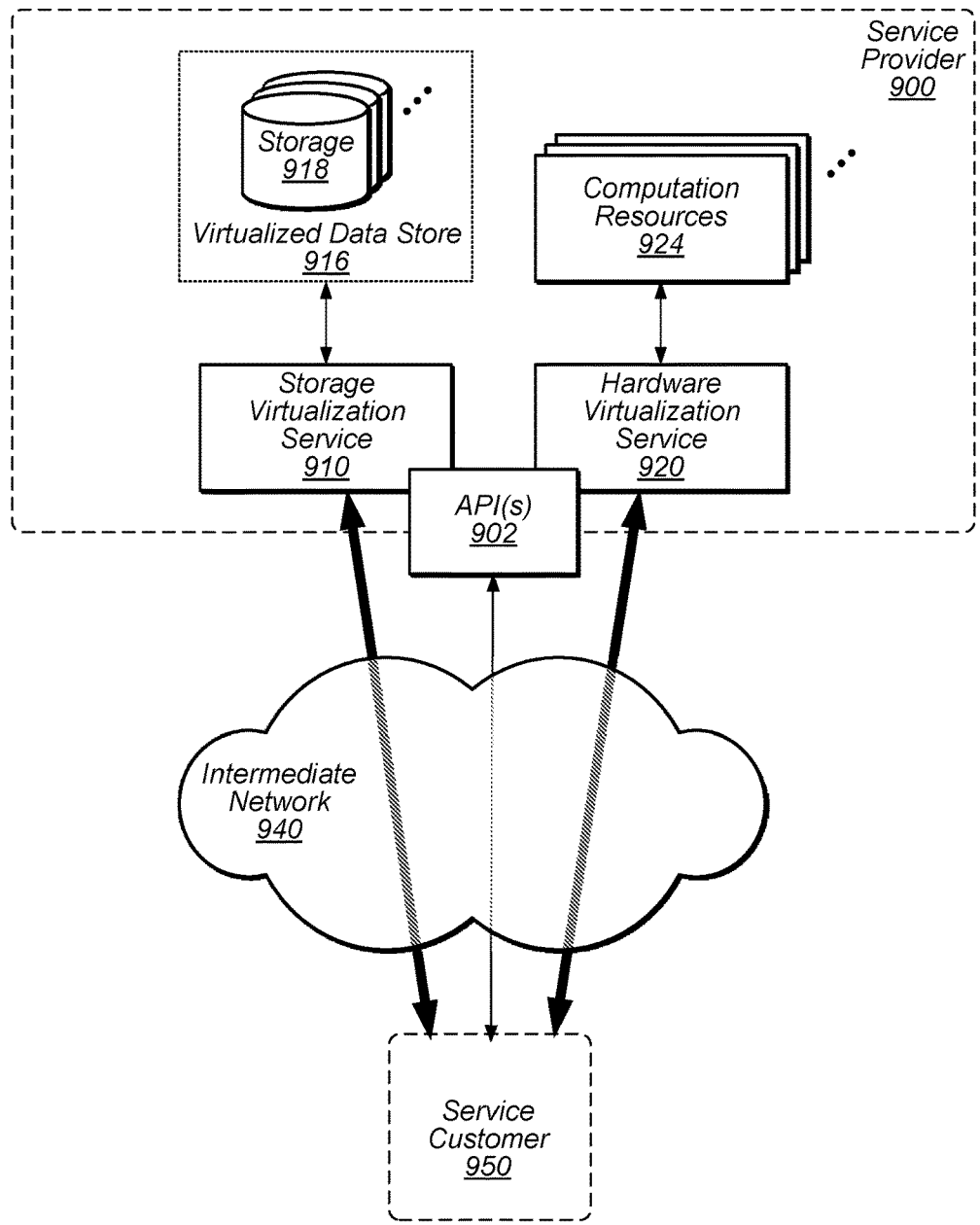
FIG. 9A illustrates a block diagram of a service provider network that implements storage and computation resources that can be used to implement a model based cooling control system, according to some embodiments.

FIG. 9A is a block diagram of an example service provider network that provides a storage virtualization service and a hardware virtualization service to customers, according to some embodiments. Hardware virtualization service 920 provides multiple computation resources 924 (e.g., VMs) to customers. Computation resources 924 of hardware virtualization service 920 may also be used by a model based cooling control system to perform computational tasks. The computation resources 924 may, for example, be rented or leased to customers of the service provider 900 (e.g., to service customer 950). Resources not leased to customers may be available for use to implement a model based cooling control system. As discussed above in regard to FIG. 6, when compute resources of a provider network are constrained, for example few resource remain not rented to customers, a model based cooling control system may operate in a simple control mode that requires less computation resources.

Service provider 900 may provide a service customer 950 the ability to implement virtual computing systems via hardware virtualization service 920 coupled to intermediate network 940. In some embodiments, hardware virtualization service 920 may provide one or more APIs 902, for example a web services interface, via which a service customer 950 may access functionality provided by the hardware virtualization service 920. In at least some embodiments, virtualized storage resources at customer 950 may correspond to a storage resource 918 that is leased, rented, or otherwise provided to customer 950.

Figure 9B:
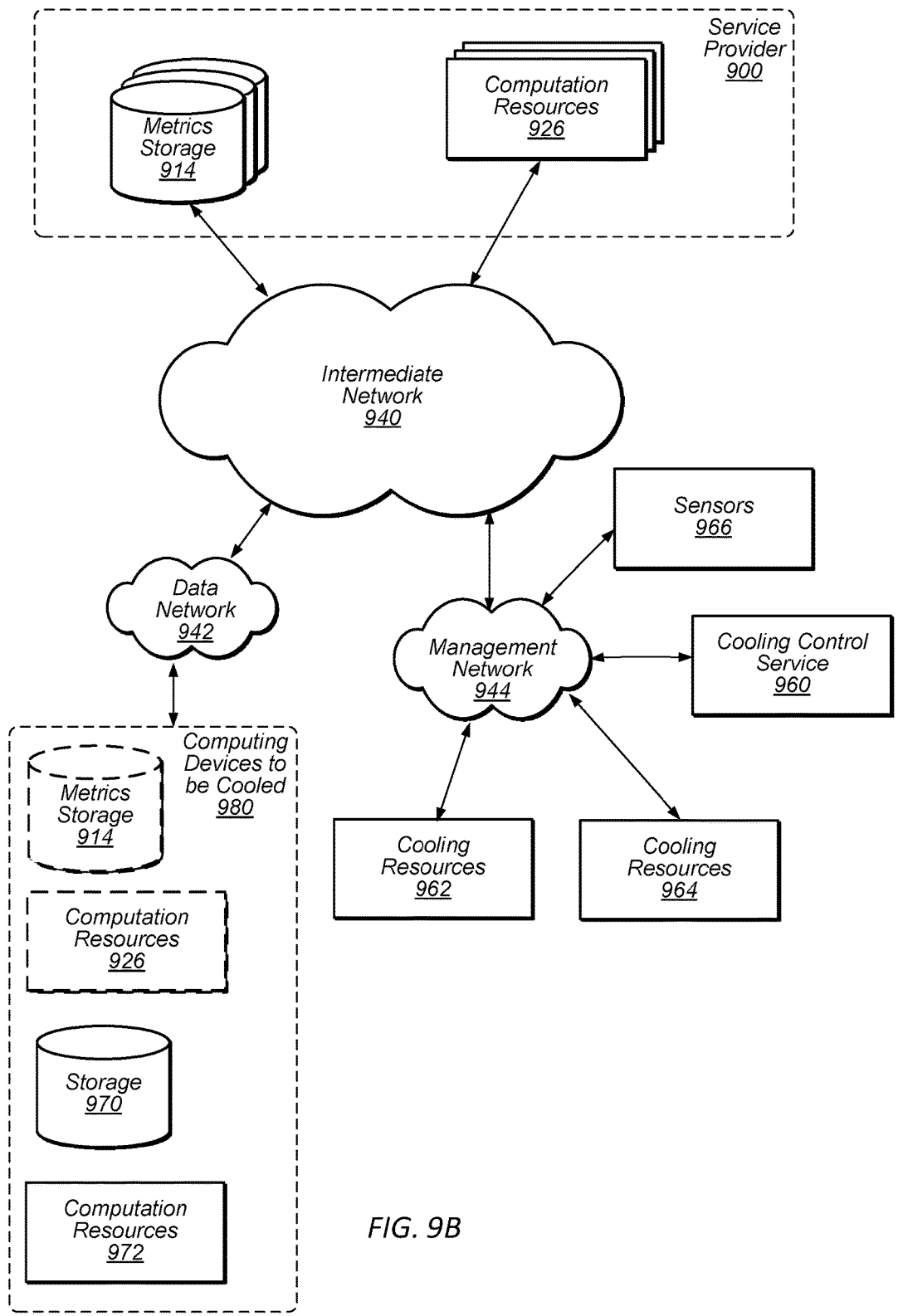
FIG. 9B illustrates a model based cooling control system implemented using computational resources and storage resources of a provider network, according to some embodiments.

FIG. 9B illustrates a model based cooling control system implemented using computational resources and storage resources of a provider network, according to some embodiments. In some embodiments, a model based cooling control system implemented using resources of a service provider network, such as service provider network 900 described above in FIG. 9A, may utilize computation resources, such as computation resources 924 of FIG. 9A and storage resources, such as storage resources 918 of FIG. 9A. For example cooling controller 960 in FIG. 9B may utilize computational resources 926 (which may be pulled from a pool of computational resources 924 that are available for use by customers of service provider 900) and may also utilize metrics storage 914 (which may include storage resources from a pool of storage resources 918 that are available for use by customers of service provider 900). A cooling control service of a model based cooling control system, such as cooling control service 960 may communicate with cooling resources, such as cooling resources 962 and 964, via a management network 944. In some embodiments, cooling resources 962 and 964 may be any of the air handling systems described in FIGS. 1 and 7. A model based cooling control system may also receive condition information from sensors, such as sensors 966, via a management network 944, and receive condition information from virtual sensors measuring computing devices to be cooled, such as virtual sensors 814 and 816 illustrated in FIG. 8 that are implemented on computing devices to be cooled 980. In some embodiments, computing devices to be cooled 980 may include computing devices that implement metrics storage 914 of service provider 900 and computation resources 926 of service provider 900. In some embodiments, computing devices to be cooled 980 may include other storage resources or computation resources of service provider 900 or computation resources and/or storage resources outside of service provider 900. For example, computing devices to be cooled 980 may also include additional storage resources 970 and additional computation resources 972. Condition information from computing devices to be cooled 980 may be transmitted via a data network, such as data network 942 connected to an intermediate network that connects with a management network, such as management network 944. In some embodiments, sensors 966 may be attached to cooling resources 962 and 964 and provide condition information relating to conditions of cooling resources 962 and 964.

A model based cooling control system implemented using resources of a provider network may collect condition information from computing devices to be cooled and condition information from sensors in a metrics storage implemented on storage resources of a provider network. For example, metrics storage 914 may collect store information from computing devices to be cooled 980 (collected via virtual sensors) and also store condition information from sensors 966. In addition cooling resources 962 and 964 may send condition information or current state information to metrics storage 914. For example, an air handling device may send a current output setting to metrics storage 914 and may also send other condition information such as a current power consumption rate of the air handling device to metrics storage 914. In some embodiments, sensors 966 may include sensors that monitor cooling resources 962 and 964.

A model based cooling control system may utilize computation resources of a provider network to perform modelling of current conditions and predicted future conditions to select an optimized set of control parameters for controlling cooling resources. For example, cooling control service 960 may request condition information from metrics storage 914 to update a CFD model or ROM CFD model that is modeled using computation resources 926. The cooling control service, such as cooling control service 960, may then send updated control outputs to cooling resources 962 and 964 based on the optimized control parameters determined by the ROM CFD model optimization performed by computation resources 926. In some embodiments, cooling resources 962 and 964 may retrieve or request updated control outputs from cooling control service 960 each control cycle. In some embodiments, cooling control service 960 may provide or push new control outputs to cooling resources 962 and 964 each control cycle.

In some embodiments, a machine learning service of a provider network may be used to determine optimal control parameters for controlling cooling resources. For example, in some embodiments, computation resources 926 may include a machine learning service of provider network 900. The machine learning service may utilize condition information stored in metrics storage 914 to generate optimized control parameters using machine learning techniques. Cooling control service 960 may provide control outputs to cooling resources 962 and 964 that are based on machine learning operations performed by a machine learning service implemented using computation resources 926.

FIG. 9B is an example implementation of a model based cooling control system that utilizes storage resources and computational resources of a provider network. In some embodiments, other suitable configurations may be used to implement a model based cooling control system using storage resources and computational resources of a provider network.

Illustrative System

Figure 10:
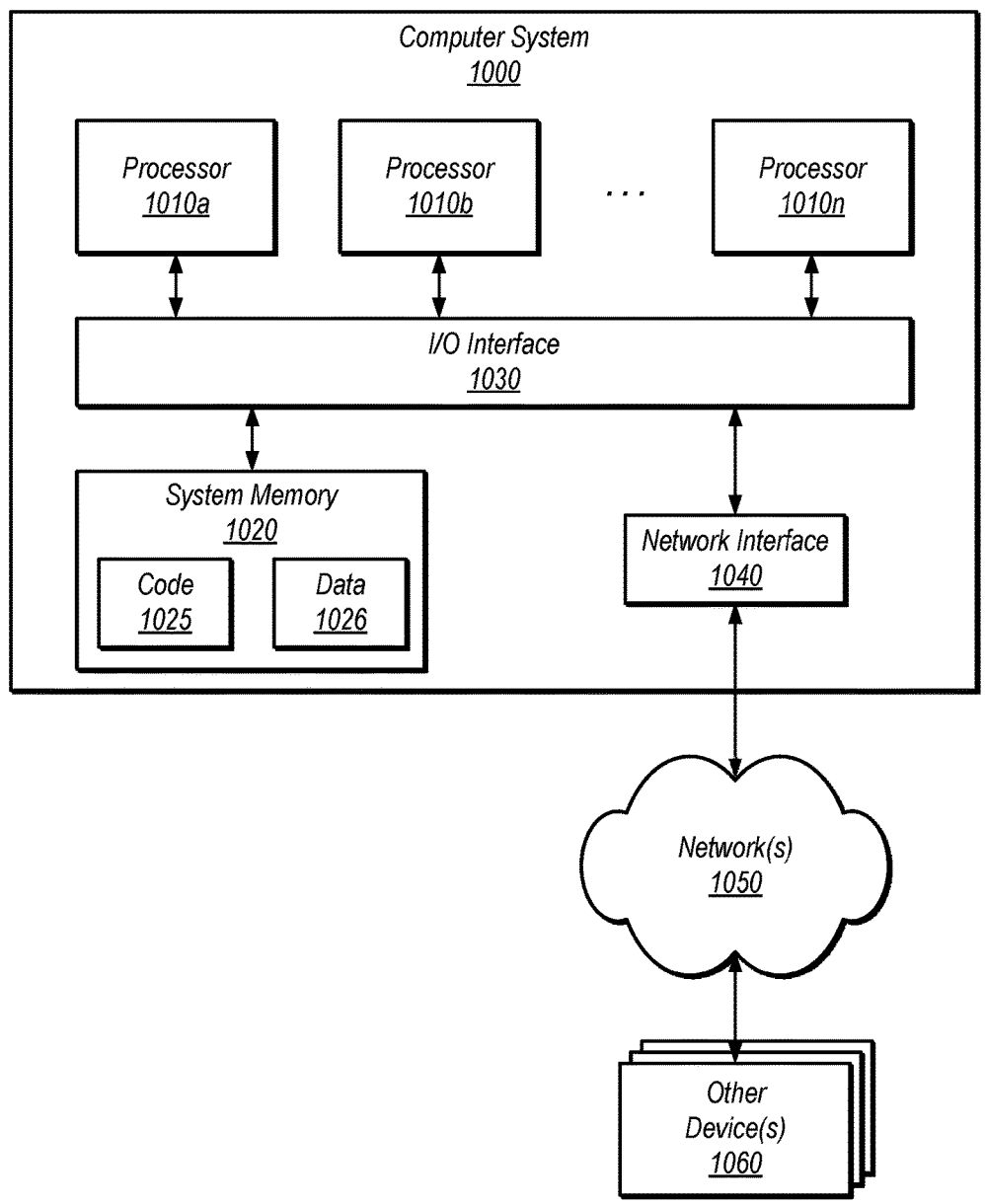
FIG. 10 illustrates a computer system that can be used in a service provider network and/or to at least partly implement a model based cooling control system, according to some embodiments.

In some embodiments, a server that implements a portion or all of one or more of the technologies, including but not limited to the various service provider methods and apparatus and the methods and apparatus for model based cooling control systems as described herein, may include a general-purpose computer system that includes or is configured to access one or more computer-accessible media, such as computer system 1000 illustrated in FIG. 10. In the illustrated embodiment, computer system 1000 includes one or more processors 1010 coupled to a system memory 1020 via an input/output (I/O) interface 1030. Computer system 1000 further includes a network interface 1040 coupled to I/O interface 1030.

In various embodiments, computer system 1000 may be a uniprocessor system including one processor 1010, or a multiprocessor system including several processors 1010 (e.g., two, four, eight, or another suitable number). Processors 1010 may be any suitable processors capable of executing instructions. For example, in various embodiments, processors 1010 may be general-purpose or embedded processors implementing any of a variety of instruction set architectures (ISAs), such as the x86, PowerPC, SPARC, or MIPS ISAs, or any other suitable ISA. In multiprocessor systems, each of processors 2010 may commonly, but not necessarily, implement the same ISA.

System memory 1020 may be configured to store instructions and data accessible by processor(s) 1010. In various embodiments, system memory 1020 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing one or more desired functions, such as those methods, techniques, and data described above for service provider methods and apparatus and the methods and apparatus for transferring data over a network, are shown stored within system memory 1020 as code 1025 and data 1026.

In one embodiment, I/O interface 1030 may be configured to coordinate I/O traffic between processor 1010, system memory 1020, and any peripheral devices in the device, including network interface 1040 or other peripheral interfaces. In some embodiments, I/O interface 1030 may perform any necessary protocol, timing or other data transformations to convert data signals from one component (e.g., system memory 1020) into a format suitable for use by another component (e.g., processor 1010). In some embodiments, I/O interface 1030 may include support for devices attached through various types of peripheral buses, such as a variant of the Peripheral Component Interconnect (PCI) bus standard or the Universal Serial Bus (USB) standard, for example. In some embodiments, the function of I/O interface 1030 may be split into two or more separate components, such as a north bridge and a south bridge, for example. Also, in some embodiments some or all of the functionality of I/O interface 1030, such as an interface to system memory 1020, may be incorporated directly into processor 1010.

Network interface 1040 may be configured to allow data to be exchanged between computer system 1000 and other devices 1060 attached to a network or networks 1050, such as other computer systems or devices as illustrated in FIGS. 1 through 9, for example. In various embodiments, network interface 1040 may support communication via any suitable wired or wireless general data networks, such as types of Ethernet network, for example. Additionally, network interface 1040 may support communication via telecommunications/telephony networks such as analog voice networks or digital fiber communications networks, via storage area networks such as Fibre Channel SANs, or via any other suitable type of network and/or protocol.

In some embodiments, system memory 1020 may be one embodiment of a non-transitory computer-accessible medium configured to store program instructions and data for implementing embodiments of methods of providing a model based cooling control system as described above relative to FIGS. 1-9. In other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computer system 1000 via I/O interface 1030. A non-transitory computer-accessible storage medium may also include any volatile or non-volatile media such as RAM (e.g. SDRAM, DDR SDRAM, RDRAM, SRAM, etc.), ROM, etc, that may be included in some embodiments of computer system 2000 as system memory 1020 or another type of memory. Further, a computer-accessible medium may include transmission media or signals such as electrical, electromagnetic, or digital signals, conveyed via a communication medium such as a network and/or a wireless link, such as may be implemented via network interface 1040.

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc, as well as transmission media or signals such as electrical, electromagnetic, or digital signals, conveyed via a communication medium such as network and/or a wireless link.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center comprising:
rack mounted computing devices in a room of the data center;
sensors configured to sense conditions related to the rack mounted computing devices; and
a cooling system, comprising:
air handling devices; and
a cooling control system, implemented on at least one of the rack mounted computing devices, wherein the cooling control system is configured to, for each present time interval of a plurality of time intervals:
receive condition information from the plurality of sensors;
iterate through sets of control parameters for controlling the air handling devices, wherein for each iteration, the cooling control system is configured to determine, based on a transient model, predicted room conditions for a given set of control parameters and predicted energy usage or water usage associated with the given set of control parameters;
select one of the sets of control parameters for controlling the plurality of air handling devices that results in less energy usage or less water usage than other ones of the sets of control parameters, wherein the predicted room conditions for the selected set of control parameters do not exceed a constraint related to cooling the rack mounted computing devices; and
generate control outputs for the air handling devices such that the air handling devices operate in accordance with the selected set of control parameters for a subsequent time interval,
wherein the cooling control system is further configured to:
monitor an amount of time required to complete said receive, said iterate, and said select; and
in response to the monitored amount of time exceed a threshold, request that an additional one of the rack mounted computing devices be allocated for implementation of the cooling control system.

2. The data center of claim 1, wherein the cooling control system is configured to release at least one of the rack mounted computing devices allocated to implement the cooling control system in response to the monitored amount of time falling below another threshold.

3. The data center of claim 1, wherein the transient model is a transient reduced order computational fluid dynamics (CFD) model of the room and the air handling devices.

4. The data center of claim 1, wherein the plurality of air handling devices are configured to operate in multiple cooling modes, wherein the multiple cooling modes comprise two or more of: a free-cooling mode, a direct evaporative cooling mode, or a mechanical cooling mode.

5. The data center of claim 4, wherein to iterate through the plurality of sets of control parameters for controlling the plurality of air handling devices, the cooling control system is configured to iterate through the multiple cooling modes; and
wherein to select the one of the sets of control parameters for controlling the air handling devices that results in less energy or less water usage usage than other ones of the sets of control parameters, the cooling control system is configured to select a cooling mode for controlling the air handling devices that results in less energy usage or less water usage than other ones of the multiple cooling modes.

6. A method comprising:

implementing a cooling control system on at least one of multiple rack mounted computing devices in a data center;

receiving, by the cooling control system, condition information from sensors that monitor conditions in the rack mounted computing devices;

iterating, by the cooling control system, through sets of control parameters for controlling air handling devices that provide cooling for the rack mounted computing devices, wherein said iterating comprises, for each iteration:

determining, based on a transient model, predicted room conditions for a given set of control parameters and predicted energy usage or water usage associated with the given set of control parameters;

selecting, by the cooling control system, one of the sets of control parameters for controlling the plurality of air handling devices that results in less energy usage or less water usage than other ones of the sets of control parameters, wherein the predicted room conditions for the selected set of control parameters do not exceed a constraint;

generating, by the cooling control system, control outputs for controlling the air handling devices such that the air handling devices operate in accordance with the selected set of control parameters for a subsequent time interval;

monitoring an amount of time required to complete said receiving, said iterating, and said selecting; and requesting, in response to the monitored amount of time exceeding a threshold, an additional rack mounted computing device be allocated for implementation of the cooling control system.

7. The method of claim 6, wherein the transient model is based, at least in part, on a computational fluid dynamics (CFD) model of the room.

8. The method of claim 6 further comprising decreasing a quantity of the rack mounted computing devices implementing the cooling control system in response to the monitored amount of time falling below another threshold.

9. The method of claim 6, wherein the threshold is an amount of time equal to or less than a minute.

10. The method of claim 6, wherein said determining, based on the transient model, predicted room conditions for the given set of control parameters and predicted energy usage or water usage associated with the given set of control parameters comprises:

determining, for future time intervals, based on the transient model, predicted room conditions and predicted energy usage or water usage for the given set of control parameters; and wherein said selecting the one of the sets of control parameters for controlling the plurality of air handling devices that results in less energy usage or less water usage than other ones of the sets of control parameters comprises:

selecting a set of control parameters that results in an overall energy or water usage over the future time intervals that is less than an overall energy or water usage over the future time intervals for other ones of the sets of control parameters.

11. The method of claim 10, wherein said determining, for the future time intervals the predicted room conditions and the predicted energy or water usage for the given set of control parameters comprises:

calculating predicted room conditions and predicted energy or water usage for one of the time intervals on one of the computing devices; and calculating, concurrently with said calculating for the one of the time intervals, predicted room conditions and predicted energy or water usage for another time interval of the time intervals on another of the computing devices.

12. The method of claim 6, wherein the set of control parameters comprises two cooling modes, wherein the two cooling modes comprise two of: a free-cooling mode, an evaporative cooling mode, or a mechanical cooling mode; and wherein said selecting the one of the set of control parameters for controlling the air handling devices comprises selecting one of the two cooling modes.

13. The method of claim 12, wherein the set of control parameters comprises two or more of: an air handler speed, a rate of water injection to an evaporative cooler used in the evaporative cooling mode, a ratio of recirculated air to fresh air, a flow rate of chilled water used in the mechanical cooling mode, or a temperature of chilled water used in the mechanical cooling mode.

14. A non-transitory computer readable storage medium storing program instructions, wherein the program instructions, when executed, are configured to:

implement a cooling controller using a rack mounted computing device of a plurality of rack mounted computing devices in a data center;

wherein the cooling controller is configured to:

receive condition information from sensors that monitor conditions in the rack mounted computing devices;

iterate through sets of control parameters for controlling air handling devices that provide cooling for the rack mounted computing devices, wherein for each iteration predicted room conditions for a given set of control parameters and predicted energy or water usage associated with the given set of control parameters are determined based on a transient model;

select one of the sets of control parameters for controlling the air handling devices that results in less energy or water usage than other ones of the sets of control parameters, wherein the predicted room conditions for the selected set of control parameters do not exceed a constraint monitor a time required to complete said receive, said iterate, and said select; and in response to the monitored time exceeding a threshold, request that an additional rack mounted computing device be allocated for implementation of the cooling controller.

15. The non-transitory computer readable storage medium of claim 14, wherein the transient model is a reduced order computational fluid dynamics (CFD) model of the room and the air handling devices.

16. The non-transitory computer readable storage medium of claim 14, wherein the cooling controller is configured to:

in response to the monitored time falling below another threshold, request that a rack mounted computing device allocated for implementation of the cooling controller be released.

17. The non-transitory computer readable storage medium of claim 14, wherein the threshold is less than a minute.

18. The non-transitory computer readable storage medium of claim 14, wherein the sensors comprise virtual sensors configured to generate condition signals indicating conditions in the rack mounted computing devices based on respective relationships between other measurements related to the rack mounted computing devices and the condition signals generated by the virtual sensors.

19. The non-transitory computer readable storage medium of claim 18, wherein the condition information from the sensors comprises respective inlet temperatures at respective ones of the rack mounted computing devices from the virtual sensors.

20. The non-transitory computer readable storage medium of claim 18, wherein the condition information from the sensors comprises a measure of recirculation in one of the racks in which the rack mounted computing devices are mounted, wherein the measure of recirculation is generated by one of the virtual sensors.

\* \* \* \* \*